(12) United States Patent
McGregor et al.

(10) Patent No.: US 7,952,019 B2
(45) Date of Patent: *May 31, 2011

(54) ELECTROCHEMICAL CELL STRUCTURE AND METHOD OF FABRICATION

(75) Inventors: Barry McGregor, Cambridgeshire (GB); Masaya Ishida, Cambridgeshire (GB); Tatsuya Shimoda, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 627 days.

This patent is subject to a terminal disclaimer.

(21) Appl. No.: 11/598,774

(22) Filed: Nov. 14, 2006

(65) Prior Publication Data

US 2007/0122931 A1     May 31, 2007

(30) Foreign Application Priority Data

Nov. 25, 2005 (GB) .................................. 0524067.6

(51) Int. Cl.
*H01L 31/042* (2006.01)

(52) U.S. Cl. ........ 136/263; 136/244; 136/252; 345/105; 257/53

(58) Field of Classification Search .................. 136/243, 136/244, 252, 263; 438/57–98, 253; 257/53; 345/105
See application file for complete search history.

(56) References Cited

U.S. PATENT DOCUMENTS

| | | | | |
|---|---|---|---|---|
| 3,859,139 A * | 1/1975 | Dews et al. | ...................... | 429/41 |
| 4,707,420 A * | 11/1987 | Wedlake | .......................... | 429/11 |
| 4,927,721 A | 5/1990 | Gratzel et al. | | |
| 5,000,180 A * | 3/1991 | Kuypers et al. | ................ | 600/360 |
| 5,350,644 A * | 9/1994 | Graetzel et al. | ................ | 429/111 |
| 5,441,827 A | 8/1995 | Gratzel et al. | | |
| 5,525,440 A * | 6/1996 | Kay et al. | ....................... | 429/111 |
| 5,830,597 A | 11/1998 | Hoffmann et al. | | |
| 6,310,282 B1 | 10/2001 | Sakurai et al. | | |
| 6,335,481 B1 * | 1/2002 | Watanabe | ...................... | 136/263 |
| 2003/0140959 A1 | 7/2003 | Gaudiana et al. | | |
| 2003/0155004 A1 * | 8/2003 | Takahashi et al. | ............. | 136/263 |
| 2004/0071865 A1 * | 4/2004 | Mosdale et al. | ............... | 427/115 |
| 2004/0112420 A1 * | 6/2004 | Spivack et al. | ................ | 136/256 |
| 2004/0252099 A1 * | 12/2004 | Walder et al. | ................. | 345/105 |

FOREIGN PATENT DOCUMENTS

| | | |
|---|---|---|
| EP | 0 855 726 A1 | 7/1998 |
| EP | 0 859 385 A1 | 8/1998 |
| EP | 1 589 548 A1 | 10/2005 |
| JP | A-2000-268891 | 9/2000 |
| JP | A-2002-075472 | 3/2002 |
| JP | A-2004-292744 | 10/2004 |
| JP | A-2005-097561 | 4/2005 |
| JP | A-2005-516371 | 6/2005 |
| WO | WO 99/66519 | * 12/1999 |
| WO | WO 99/66519 A1 | 12/1999 |
| WO | WO 01/46987 A2 | 6/2001 |
| WO | WO 03/065472 A2 | 8/2003 |
| WO | WO 2005/083730 A1 | 9/2005 |

* cited by examiner

*Primary Examiner* — Basia Ridley
*Assistant Examiner* — Christina Chern
(74) *Attorney, Agent, or Firm* — Oliff & Berridge, PLC

(57) ABSTRACT

An electrochemical cell and a method of manufacturing the same are provided. The electrochemical cell comprises a first conductive layer; a metal oxide layer formed on the first conductive layer, the metal oxide layer comprising a plurality of adjacent metal oxide cells, spaced from one another; a functional dye layer formed on the metal oxide layer; a second conductive layer; and an electrolyte between the functional dye layer and the second conductive layer; wherein at least one of the first and second conductive layers is transparent. In one embodiment, the electrochemical cell further comprises separating means formed on the first conductive layer and surrounding each of the plurality of adjacent metal oxide cells.

9 Claims, 6 Drawing Sheets

ELECTROCHEMICAL CELL STRUCTURE AND METHOD OF FABRICATION

FIELD OF THE INVENTION

Several aspects of the present invention relates to an electrochemical cell structure and a method of fabrication.

BACKGROUND OF THE INVENTION

The International Energy Agency's "World Energy Outlook" predicts that global primary energy demand will increase by 1.7% per year from 2000 to 2030. It also predicts that 90% of this demand will be met by fossil fuels. Consequently, there will be a 1.8% per year increase in carbon dioxide from 2000 to 2030, reaching 38 billion tonnes in 2030. Cleaner, renewable energy sources, including solar cells, have long been heralded as counters to this increased pollution trend. While advanced silicon based solar cells are now widely commercially available, their uptake has been slow due to high production costs, a lack of robustness and associated visual pollution resulting from the large surface exposure requirements.

Dye Sensitised Solar Cells (DSSC) are an alternative to crystalline solar cells that are cheaper than crystalline solar cells to produce. However, DSSC's are less efficient than crystalline solar cells. Therefore, DSSC's require significant area coverage to be effective power generators.

U.S. Pat. No. 4,927,721 entitled "Photo-Electrochemical Cell", by M Gratzel et al. discloses a typical DSSC. As illustrated in FIG. 1, the DSSC 10 comprises a first transparent insulating layer 1; a first transparent conductive oxide (TCO) electrode layer 2; a transparent metal oxide layer 3 of titanium dioxide ($TiO_2$); a molecular monolayer of sensitiser (dye) 4; an electrolyte layer 5; a second transparent conductive oxide (TCO) electrode layer 6; and a second transparent insulating layer 7.

A DSSC generates charge by the direct absorption of visible light. Since most metal oxides absorb light predominantly in the ultra-violet region of the electromagnetic spectrum, a sensitiser (dye) 4 is absorbed onto the surface of metal oxide layer 3 to extend the light absorption range of the solar cell into the visible light region.

In order to increase the amount of light that the metal oxide layer 3 and the sensitiser (dye) layer 4 can absorb, at least some portion of the metal oxide layer 3 is made porous, increasing the surface area of the metal oxide layer 3. This increased surface area can support an increased quantity of sensitiser (dye) 4 resulting in increased light absorption and improving the energy conversion efficiency of the DSSC to more than 10%.

An electrochromic display (ECD) is a relatively new electrochemical, bi-stable display. While the application is different to the DSSC, these devices share many physical attributes, illustrated in FIG. 1, exchanging the sensitiser (dye) layer 4 by an electrochromic material layer which undergoes a reversible colour change when an electric current or voltage is applied across the device; being transparent in the oxidised state and coloured in the reduced state.

When a sufficient negative potential is applied to the first transparent conductive oxide (TCO) electrode layer 2, whilst the second transparent conductive electrode oxide (TCO) layer 6 is held at ground potential, electrons are injected into the conduction band of the metal oxide semiconductor layer 3 and reduce the adsorbed molecules (the coloration process). The reverse process occurs when a positive potential is applied to the first transparent conductive oxide (TCO) electrode layer 2 and the molecules become bleached (transparent).

A single electrochromic molecular monolayer on a planar substrate would not absorb sufficient light to provide a strong colour contrast between the bleached and unbleached states. Therefore a highly porous, large surface area, nanocrystalline metal oxide layer 3 is used to promote light absorption in the unbleached state by providing a larger effective surface area for the electrochromophore to bind onto. As light passes through the thick metal oxide layer 3, it crosses several hundreds of monolayers of molecules coloured by the sensitiser (dye) 4, giving strong absorption.

Since the structure of both electrochemical devices is similar, we describe only the method of DSSC manufacture as an example. Equally, this process could be applied with little modification to the ECD manufacture.

In order to manufacture the DSSC 10 illustrated in FIG. 1, a metal oxide layer 3 of several microns thickness is deposited onto the first transparent conductive oxide (TCO) electrode layer 2, using any one of several techniques, such as screen printing, doctor blading, sputtering or spray coating a high viscosity paste. A typical paste consists of water or organic solvent based metal oxide nanoparticle suspensions (5-500 nm diameter), typically titanium dioxide ($TiO_2$), a viscosity modifying binder, such as polyethylene glycol (PEG), and a surfactant, such as Triton-X. Following deposition, the paste is dried to remove the solvent, and then sintered at temperatures up to 450° C. This high temperature process modifies the metal oxide particle size and density, and ensures the removal of the organic binder constituents, such as polyethylene glycol (PEG) to provide a good conductive path throughout and a well defined material porosity. Sintering also provides good electrical contact between the metal oxide particles 3 and the first transparent conductive oxide (TCO) electrode layer 2.

After drying and cooling, the porous metal oxide layer 3 is coated with sensitiser (dye) 4 by immersion in a low concentration ($\leq 1$ mM) sensitiser (dye) solution for an extended period, typically 24 hours, to allow absorption of the sensitiser (dye) 4 onto the metal oxide layer 3 through a functional ligand structure, that often comprises a carboxylic acid derivative. Typical solvents used in this process are acetonitrile or ethanol, since aqueous solutions would inhibit the absorption of the sensitiser (dye) 4 onto the surface of the metal oxide layer 3.

The first transparent conductive oxide (TCO) electrode layer 2, having the porous metal oxide layer 3 and sensitiser (dye) layer 4 formed thereon, is then assembled with the second transparent conductive oxide (TCO) electrode layer 6. Both electrode layers 2, 6 are sandwiched together with a perimeter spacer dielectric encapsulant to create an electrode-to-electrode gap of at least 10 μm, before filling with the electrolyte layer 5. The spacer material is most commonly a thermoplastic that provides an encapsulation seal. Once the electrolyte layer 5, which is most commonly an iodide/triiodide salt in organic solvent, is introduced, the DSSC is completed by sealing any remaining aperture with either a thermoplastic gasket, epoxy resin or a UV-curable resin to prevent the ingress of water and hence device degradation.

Most, if not all, of the materials used to fabricate the DSSC can be handled in air and also under atmospheric pressure conditions, removing the necessity for expensive vacuum processes associated with crystalline solar cell fabrication. As a result, a DSSC can be manufactured at a lower cost than a crystalline solar cell.

The ECD fabrication process is very similar to that for the DSSC, with several exceptions. The porous metal oxide layer 3 is often patterned by screen printing to provide a desired electrode image, allowing the device to convey information by colouring or bleaching selected regions. Additionally, the sensitiser (dye) layer 4 is replaced with an absorbed electrochromophore material layer. Furthermore, a permeable diffuse reflector layer, typically large particles of sintered metal oxide, can be positioned between the first and second electrode layers 2, 6 to increase the viewed image contrast.

U.S. Pat. No. 5,830,597, entitled "Method and Equipment for Producing a Photochemical Cell", by H Hoffmann also discloses a DSSC 100. As illustrated in FIG. 2, the DSSC 100 comprises a first substrate 101 of glass or plastic; a first transparent conductive oxide (TCO) layer 102; a titanium dioxide ($TiO_2$) layer 103, a dye layer 104; an electrolyte layer 105; a second transparent conductive oxide (TCO) layer 106; a second substrate 107 of glass or plastic; and insulating webs 108, 109. The insulating webs 108, 109 are used to form individual cells 110 in the DSSC 100.

An individual cell 110 formed between the insulating web 108 and the insulating web 109 is different from the adjoining individual cell 110 formed between the insulating web 109 and the insulating web 108. This is because the $TiO_2$ layer 103 and the electrolyte layer 105 are interchanged in each adjoining individual cell 110. Thus, the electrical polarity of the adjoining individual cells 110 is opposite. This alternate division of different layers results in the formation of conducting layers 111 from the electrically conductive layers 102 and 106, each conducting layer 111 connecting a positive (negative) pole of one individual cell 110 to the negative (positive) pole of an adjacent individual cell 110. The resultant structure provides a method of increasing the overall DSSC output voltage, without the necessity of incorporating a multi-layered structure.

In order to improve the incident photon to current conversion efficiency and control the stability/reproducibility of the DSSC performance, it is important to precisely control the physical properties of the metal oxide layer, and hence the absorption of the sensitiser (dye) molecule. However, metal oxide layer fabrication using screen-printing often results in a ±5% film thickness variation caused by residual blocked or dirty screen cells, adhesion to the screen during separation from the substrate surface and trapped bubble expansion during drying, caused by the inability to completely outgas a viscous paste. Other methods, such as doctor-blading, also suffer from an inability to provide a well defined thick metal oxide layer without significant spatial deviations. Subsequent porosity and film quality deviations are therefore likely to occur throughout such metal oxide layers, resulting in a degradation of efficiency and image quality for the DSSC and ECD, respectively.

In the case of the ECD, screen-printing demands are further exacerbated by the requirement to create ever finer metal oxide layer features for higher quality images, i.e. increase the dots-per-inch (dpi) for a pixelated display. As the dpi increases, the smallest feature size becomes limited as the screen mesh size approaches the mesh partition width.

As a result, fabrication of an electrochemical device based on a functionally sensitised thick porous metal oxide layer, as for the DSSC and ECD, using the aforementioned fabrication techniques are inappropriate from the view points of device reproducibility and adaptability to large size device production.

SUMMARY OF THE INVENTION

The present invention aims to address the above mentioned problems of manufacturing electrochemical cells (DSSC's and ECD's) of the prior art, to improve the efficiency with which they are made and thus further decrease their fabrication costs.

In a first embodiment of the present invention an electrochemical cell is provided. The electrochemical cell comprising; a first conductive layer; a metal oxide layer formed on the first conductive layer, the metal oxide layer comprising a plurality of adjacent metal oxide cells, spaced from one another; a functional dye layer formed on the metal oxide layer; a second conductive layer; and an electrolyte between the functional dye layer and the second conductive layer, wherein at least one of the first and second conductive layers is transparent. In another embodiment the electrochemical cell further comprises: separating means formed on the first conductive layer and surrounding each of the plurality of adjacent metal oxide cells.

In another embodiment the separating means is a polymer pattern or a polyimide pattern. In another embodiment at least part of the separating means is hydro- and/or oleophobic and wherein the first conductive layer is hydro- and/or oleophilic.

In a further embodiment the separating means forms a matrix of cells on the first conductive layer. In one embodiment each of the metal oxide cells is substantially square shaped, substantially circular shaped, substantially hexagonal shaped, or substantially rectangular shaped. In a further embodiment the separating means are banks.

In another embodiment the electrochemical cell further comprises: an electrocatalytic layer between the electrolyte and the second conductive layer. In a further embodiment the electrocatalytic layer is any one of platinum, ruthenium, rhodium, palladium, iridium or osmium.

In another embodiment the electrochemical cell further comprises: a first insulating substrate on a side of the first conductive layer opposite to the metal oxide layer. In a further embodiment the electrochemical cell further comprises: a second insulating substrate on a side of the second conductive layer opposite to the electrolyte. In another embodiment at least one of the first and second insulating substrates is glass. In another embodiment at least one of the first and second insulating substrates is plastic.

In one embodiment the metal oxide layer is a semiconductor. In another embodiment the metal oxide layer is a titanium dioxide layer. In another embodiment the metal oxide layer comprises particles of metal oxide, and wherein the functional dye layer is formed on a surface of the particles of the metal oxide layer. In another embodiment the first and second conductive layers are continuous layers. In another embodiment the first conductive layer is a transparent conductive oxide layer. In a further embodiment the second conductive layer is a transparent conductive oxide layer.

In one embodiment the electrochemical cell is a dye sensitised solar cell. In another embodiment the electrochemical cell is an electrochromic display. In another embodiment the functional dye layer is an electrochromophore layer.

In a second embodiment of the present invention a method of forming an electrochemical cell is provided. the method comprising: forming a first conductive layer; forming a metal oxide layer on the first conductive layer, the metal oxide layer comprising a plurality of adjacent metal oxide cells, spaced from one another; forming a functional dye layer on the metal oxide layer; forming a second conductive layer; and providing an electrolyte between the functional dye layer and the second conductive layer, wherein at least one of the first and second conductive layers is transparent.

In another embodiment the method further comprises: forming separating means on the first conductive layer surrounding each of the plurality of adjacent metal oxide cells. In a further embodiment the metal oxide layer is inkjet printed onto the first conductive layer. In another embodiment the metal oxide layer is inkjet printed onto the first conductive layer in one step. In another embodiment the metal oxide layer is inkjet printed onto the first conductive layer without drying process between inkjet printings.

In one embodiment the method further comprises: providing an electrocatalytic layer between the electrolyte and the second conductive layer. In another embodiment the method further comprises: forming the first conductive layer on a first insulating substrate, whereby the first insulating substrate and the metal oxide layer are on opposite sides of the first conductive layer. In a further embodiment the method further comprises: forming the second conductive layer on a second insulating substrate, whereby the second insulating substrate and the electrolyte are on opposite sides of the second conductive layer.

The method of fabrication of the electrochemical cell of the present invention, using inkjet printing, is advantageous over screen printing fabrication as format scaling (up or down) does not require re-investment in machine hardware. This is because inkjet fabrication is software controlled and the software can be reconfigured without the expense of commissioning new screens. Additionally, inkjet heads are significantly more durable, than patterned screens, as patterned screens last only approximately 100 uses.

Furthermore, the drop on demand placement enabled by inkjet fabrication is less wasteful than screen printing. Unlike conventional inkjet overwriting, where each deposited layer is dried and then printed over to produce a thick deposition, the inkjet flood filling technique, which doses a confined region with a large volume of liquid to provide the required deposit thickness, has been shown to produce fracture-free metal oxide layers. Moreover, the surface confinement used to enable flood filling, through the use of a bank structure, ensures long range uniform material distribution and therefore uniform and repeatable performance.

BRIEF DESCRIPTION OF THE DRAWINGS

Embodiments of the present invention will now be described by way of further example only and with reference to the accompanying drawings, in which.

DETAILED DESCRIPTION

Figure 1:
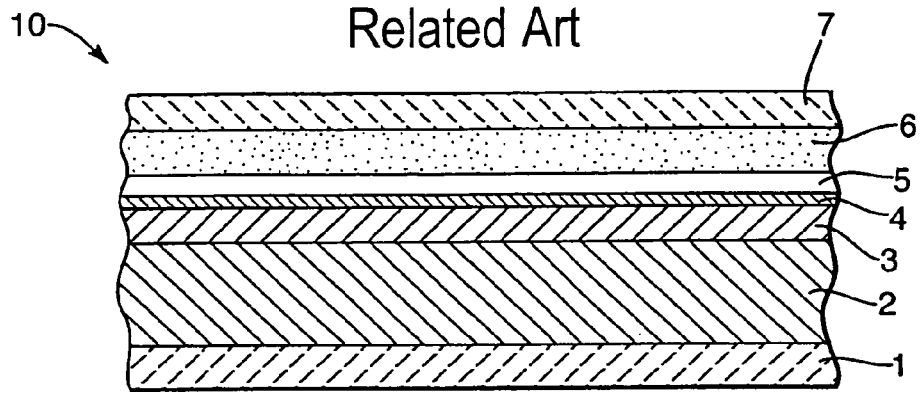
FIG. 1 illustrates a typical Dye Sensitised Solar Cell (DSSC) of the prior art.
Figure 2:
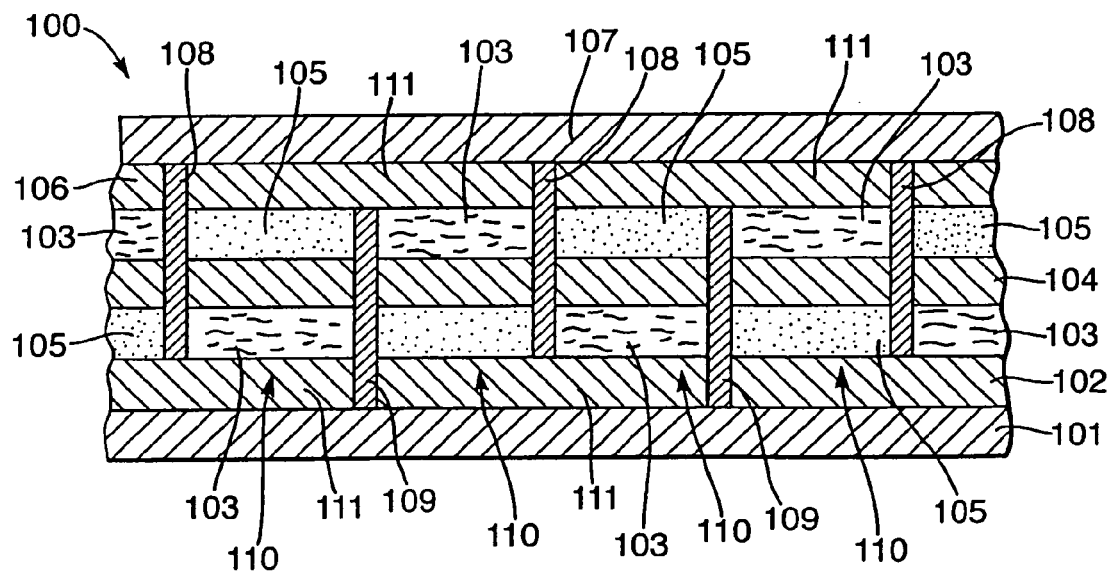
FIG. 2 illustrates a further DSSC of the prior art.
Figure 3:
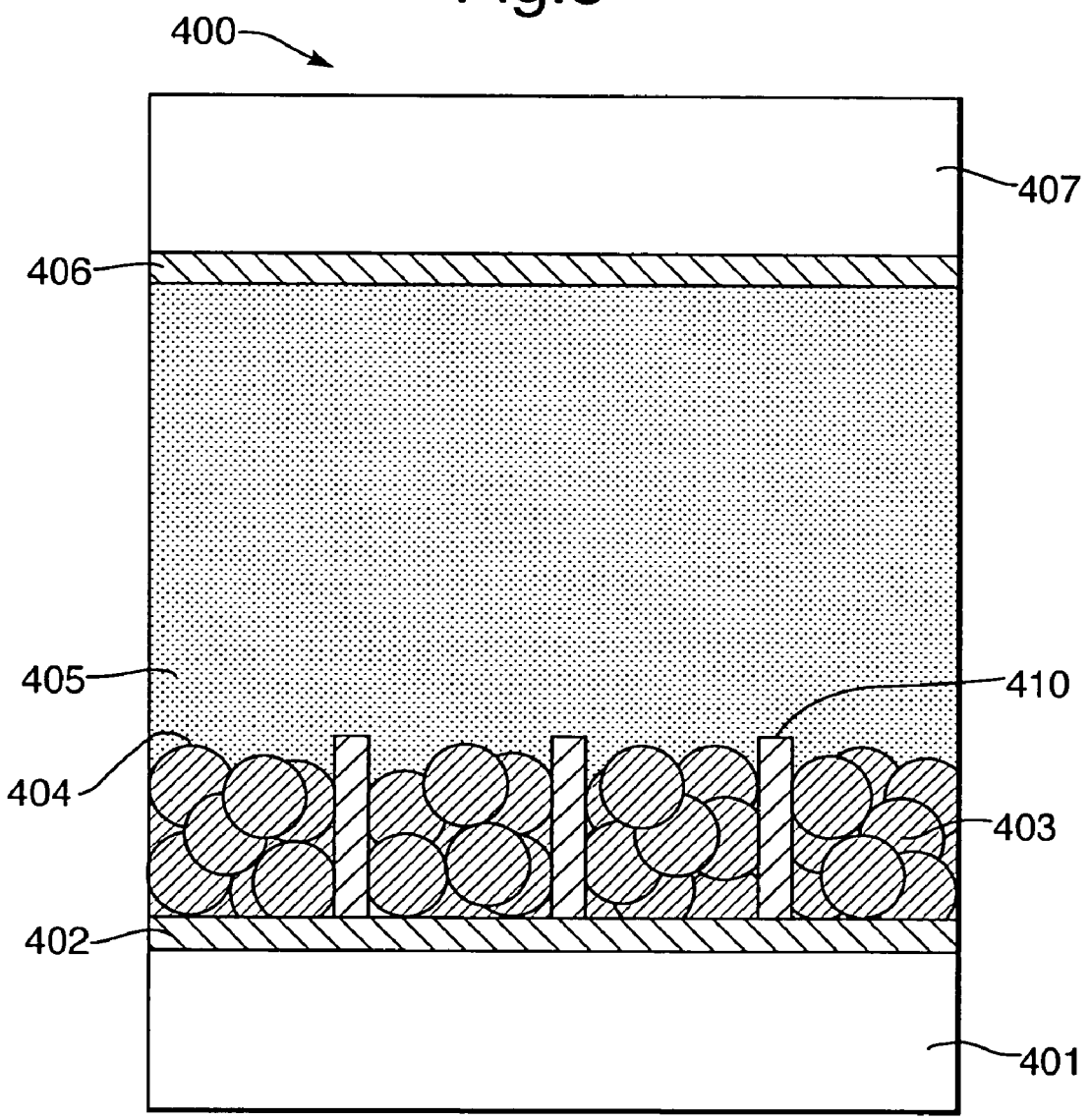
FIG. 3 illustrates an electrochemical cell of the present invention.

The present invention relates to an electrochemical cell such as a Dye Sensitised Solar Cell (DSSC) or an electrochromic display (ECD). One electrochemical cell 400 of the present invention comprises, with reference to FIG. 3, a first transparent insulating substrate layer 401; a first transparent conductive oxide (TCO) electrode layer 402; a metal oxide layer 403; a sensitiser (dye)/electrochromic material layer 404; an electrolyte layer 405; a second TCO electrode layer 406; and a second transparent insulating substrate layer 407.

The first and second transparent insulating substrate layers 401, 407 are preferably glass or plastic. The metal oxide layer 403 is preferably titanium dioxide ($TiO_2$) and is a semiconductor.

The metal oxide layer 403 should preferably be a material which promotes intimate adhesion of the sensitiser (dye)/electrochromic material layer 404 on its surface. Additionally, the particles of the metal oxide layer 403 must be reasonably light transmissible. Particles greater then 500 nm are expected to be opaque and are not generally considered appropriate for use in the present invention. Such large particles would also tend to cause inkjet nozzle blocking.

In a first embodiment of the present invention, a bank structure 410 is formed on the first TCO layer 402, prior to the application of the metal oxide layer 403, so that a metal oxide layer 403 is formed of isolated cells. In one embodiment the bank structure 410 may be formed from a polymer or a polyimide.

Preferably, the bank structure is hydro- and/or oleophobic in some part while the TCO layer 402 is hydro- and/or oleophilic, depending on the nature of the metal oxide ink used to form the metal oxide layer 403.

The bank structure 410 can take on any desired shape forming a matrix of individual pixel cells on the first TCO layer 402, within which the isolated metal oxide cells are formed; such that no metal oxide bridges the bank structure 410 to cause short circuiting.

When the electrochemical cell is an ECD, it is essential that all the metal oxide cells (pixels) are electrically isolated from one another to control the image formation. While the metal oxide cell electrical isolation is not essential when the electrochemical cell is a DSSC, it is preferable to maintain a uniform metal oxide distribution throughout the active device area.

The ECD electrochemical cell can be considered as being composed of a plurality of micro-electrochemical cells, wherein each micro-electrochemical cell may have different coloured electrochromophore layers 404. Each micro-electrochemical cell is separated from the other micro-electrochemical cells, which together form the ECD, by the bank structure 410. Each micro-electrochemical cell is preferably between 20 μm to 500 μm across.

In a further embodiment of the present invention an electrocatalytic layer can be formed between the electrolyte layer 405 and the second TCO layer 406. The electrocatalytic layer is preferably greater than 2 nm thick and is selected to enhance the electrolyte regeneration. In the case of the DSSC, effective electrocatalytic metals can be selected from the platinum group metals; platinum, ruthenium, rhodium, palladium, iridium or osmium. The use of an electrocatalytic layer improves the overall performance of the electrochemical cell of the present invention.

The present invention also relates to a method of fabricating the electrochemical cell 400 of the present invention. FIG. 4 illustrates a process flow diagram for the fabrication of an electrochemical cell 400 of the present invention.

Figure 4A:
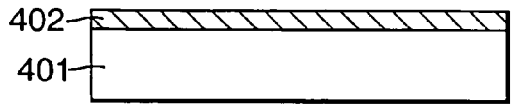
FIG. 4 illustrates a process flow diagram for the fabrication of an electrochemical cell of the present invention.
Figure 4A:
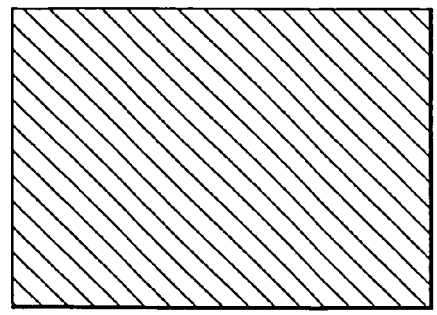

The TCO layer 402 is formed on the first transparent insulating substrate layer 401, FIG. 4a. Preferably, the TCO layer 402 has a sheet resistivity of 8-10 Ω.sq. and is made of indium tin oxide or fluorine doped tin oxide. Fluorine doped tin oxide is preferable due to its cheapness and inertness during the high temperature sintering stage.

Figure 4B:
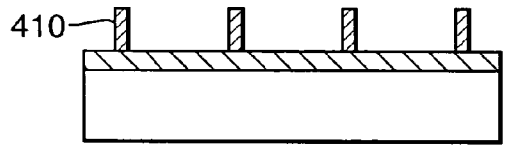
Figure 4B:
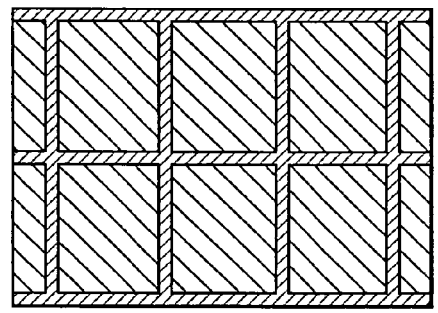
Figure 4C:
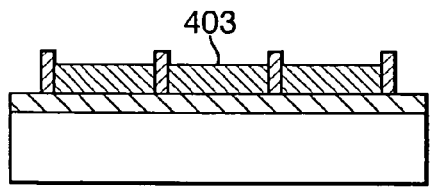
Figure 4C:
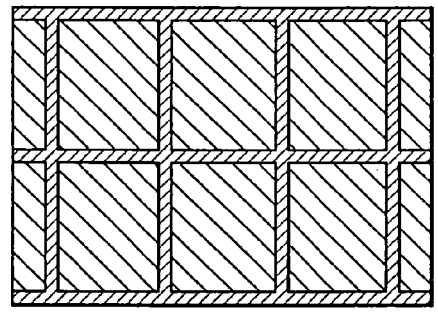
Figure 4D:
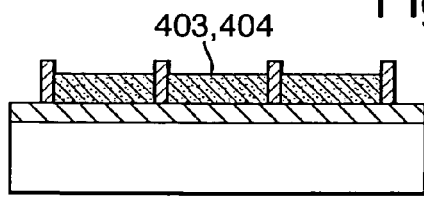
Figure 4D:
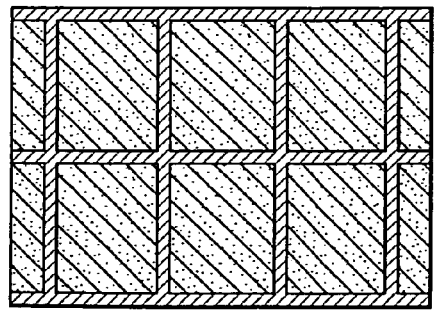

The bank structure 410 is then fabricated on the TCO layer 402, FIG. 4b. In the first embodiment of the present invention, the bank structure 410 forms a matrix of square pixel cells. In order to form the bank structure 410 on the TCO layer 402, a photo-reactive polyimide source material is coated on to the TCO layer 402 and dried. A mask, in the shape of the matrix of pixel cells is then applied to the TCO layer 402. An ultraviolet (UV) light is irradiated through the mask to cause cross-linking of the polyimide in the exposed regions. The unexposed regions are removed by chemical developing, and the bank structure 410 is thermally cured at 350° C.

The TCO layer 402 having a bank structure 410 is then treated by oxygen or oxygen plus carbon tetrafluoride plasma to remove residual polyimide in the exposed regions. A carbon tetrafluoride ($CF_4$) plasma treatment is then applied to cause the polyimide bank structure 410 to become hydrophobic, while preserving the hydrophilic nature of the TCO layer 402.

The metal oxide layer 403 is then inkjet printed onto the TCO layer 402 having the bank structure 410 formed thereon. The metal oxide ink is jetted into each of the isolated pixel cells to form the metal oxide layer 403, FIG. 4c. Preferably, aqueous colloidal titanium dioxide ($TiO_2$) inks of concentration $\leq$10% volume fraction (v/v) are used, containing particles <500 nm in diameter. Other additives can be included in the metal oxide ink to ensure compatibility of the solution with the inkjet head. After deposition, the metal oxide layer 403 is dried and then sintered in air at $\geq$300° C.

The thickness of the metal oxide layer 403 is controlled by the concentration of the aqueous colloidal $TiO_2$ ink, and the deposition volume. The resultant deviation in the peak thickness of the metal oxide layer 403 is less than 1.5% between cells over a 50 $cm^2$ substrate area.

The substrate layer 401 comprising the TCO layer 402, the bank structure 410 and the metal oxide layer 403 is then immersed in sensitiser (dye) 404 for a period of time. The sensitiser (dye) 404 is thereby absorbed onto the surface of the metal oxide layer 403, FIG. 4d. For the DSSC example, the substrate was immersed in a 0.3 mM solution of N719 (obtained from Solaronix) in dry ethanol for 24 hours. After immobilisation of the sensitiser (dye) 404, the substrate is rinsed in ethanol and blown dry using nitrogen.

The first TCO layer 402, having the porous metal oxide layer 403 and sensitiser (dye) layer 404 formed thereon, is then assembled with the second TCO layer 406. Both electrode layers 402, 406 are sandwiched together with a perimeter spacer to create an electrode-to-electrode gap, before filling with the electrolyte layer 405. Once the electrolyte layer 405 is introduced, the DSSC is completed by sealing the remaining aperture.

If an electrocatalytic layer is desired in the electrochemical cell of the present invention, then the electrocatalytic layer is formed on the second TCO layer 406 prior to the electrode layers 402, 406 being sandwiched together.

An inkjet head is capable of providing a well defined aqueous colloidal metal oxide ink droplet, with volume deviation less than ±1.5%, to a precise location on the TCO layer 402. Moreover, this volumetric accuracy of $\leq$1.5% represents that for a commercial printer head. Several industrial heads and complementary techniques are available which can reduce this figure to $\leq$1%.

Inkjet deposition enables accurate positioning of the metal oxide on the TCO layer 402, within each pixel cell of the bank structure 410 as required. Thus, the thickness of the metal oxide layer 403 can be controlled precisely and a uniform porous metal oxide layer 403 can be obtained.

When at least part of the bank structure 410 is hydro- and/or oleophobic, and at least part of the TCO layer 402 is hydro- and/or oleophilic, the bank structure 410 repels the deposited metal oxide ink, thus correcting the final position of the deposited metal oxide ink droplets on the target surface and compensating for the inherent ±15 μm droplet lateral divergence from the inkjet nozzle axis. This repulsion is especially beneficial in the case of the ECD to prevent pixel short-circuits caused by metal oxide 403 bridging the bank structure 410. The bank structure 410 also enables the formation of a narrower gap between ECD pixels than otherwise permitted by the 30 μm spacing necessary for bank-less free-printing, enabling a higher active area ratio to be obtained in the ECD and increased image quality.

Only a portion of the bank structure 410 needs to be hydro- and/or oleophobic. For example, if the bank wall is hydrophilic and its top hydrophobic, then for an aqueous metal oxide ink the resultant deposit profile will be modified compared to the fully hydrophobic case, as illustrated in FIG. 5.

Figure 5A:
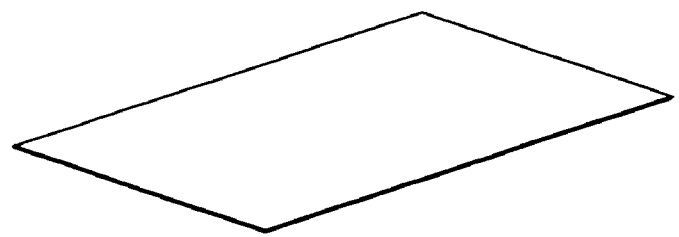
FIG. 5 illustrates a simulation of the inkjet liquid profile using (a) a completely hydrophobic bank and (b) a bank with hydrophilic sides.
Figure 5B:
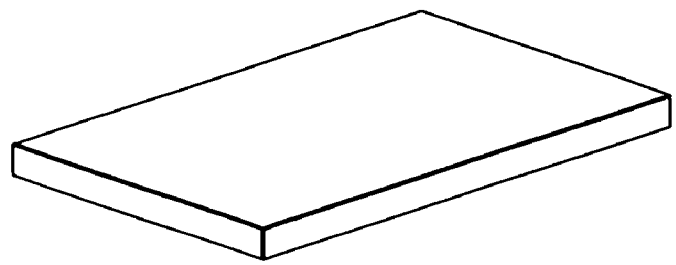

FIG. 5 illustrates a simulation of the inkjet liquid profile using (a) a completely hydrophobic bank and (b) a bank with hydrophilic sides. The bank structure 410 has been removed from FIG. 5.

The metal oxide layer 403 should be several microns thick to function effectively. In traditional inkjet printing the thickness of the deposit is built up to the desired profile using an overwriting technique, wherein each deposited layer is dried and sintered and then overwritten with another layer of ink, and so on, until the desired thickness is reached.

However, the method of the present invention uses a flood filling technique, whereby a large volume of metal oxide ink is introduced into each pixel cell of the bank structure 410 in one pass. The bank structure 410 prevents the metal oxide ink from spreading into neighbouring pixel cells. Using this process, only a single drying and sintering stage is required to produce the desired thickness of the metal oxide layer 403.

Figure 6:
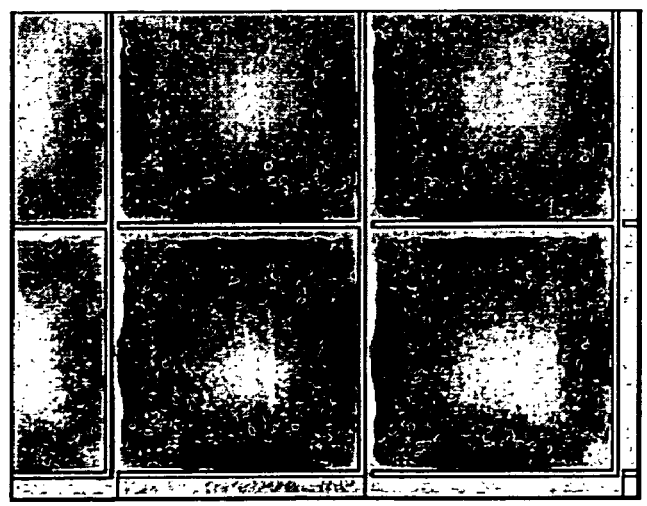
FIG. 6 illustrates several pixel cells of a bank structure filled with metal oxide.

FIG. 6 illustrates several pixel cells of the bank structure 410 filled with metal oxide.

A bank structure 410 having a matrix of square pixel cells produces a quasi-pyramidal dry metal oxide topography when the flood filling technique is used to fill each pixel cell with metal oxide ink. The bank structure 410 acts to confine the deposited metal oxide ink to a local region, within the pixel cells on the TCO layer 402. Without this confinement, the metal oxide ink would be distributed freely across the TCO layer 402 following deposition and would form a continuous metal oxide layer 403.

Figure 7A:
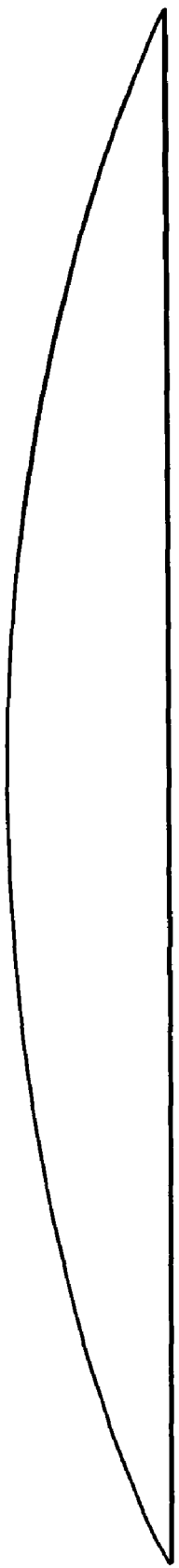
FIG. 7 illustrates the cross-sectional profiles for the same volume of metal oxide ink deposited in two regions of the same size, one without and one with a bank structure.
Figure 7B:

By example, FIG. 7 illustrates the cross-sectional profiles for the same volume of metal oxide ink evenly deposited in a region measuring 400 μm×400 μm. FIG. 7a illustrates a TCO layer 402 without a bank structure 410 and FIG. 7b illustrates a TCO layer 402 having a 2 μm wide bank structure 410 formed at 76 μm intervals. The liquid gradient is much shallower when no bank structure 410 is present, which results in greater metal oxide layer 403 non-uniformity at the edge than in the bank confined case.

The bank structure 410 of the present invention increases the metal oxide layer's 403 ability to accommodate bending stress without fracturing, compared to a continuous metal oxide layer 403. This enables a flexible substrate 401 to be utilised, such as a plastic first insulating substrate 401.

In the first embodiment of the present invention, the bank structure 410 comprises a matrix of square pixel cells as illustrated in FIG. 6. However, the pixel cells are not limited to being square. When the electrochemical cell 400 of the present invention is an ECD, square pixels are preferred as they are compatible with active matrix backplane fabrication technology. However, when the electrochemical cell 400 of the present invention is a DSSC, several different pixel cell shapes can be used.

Figure 8:
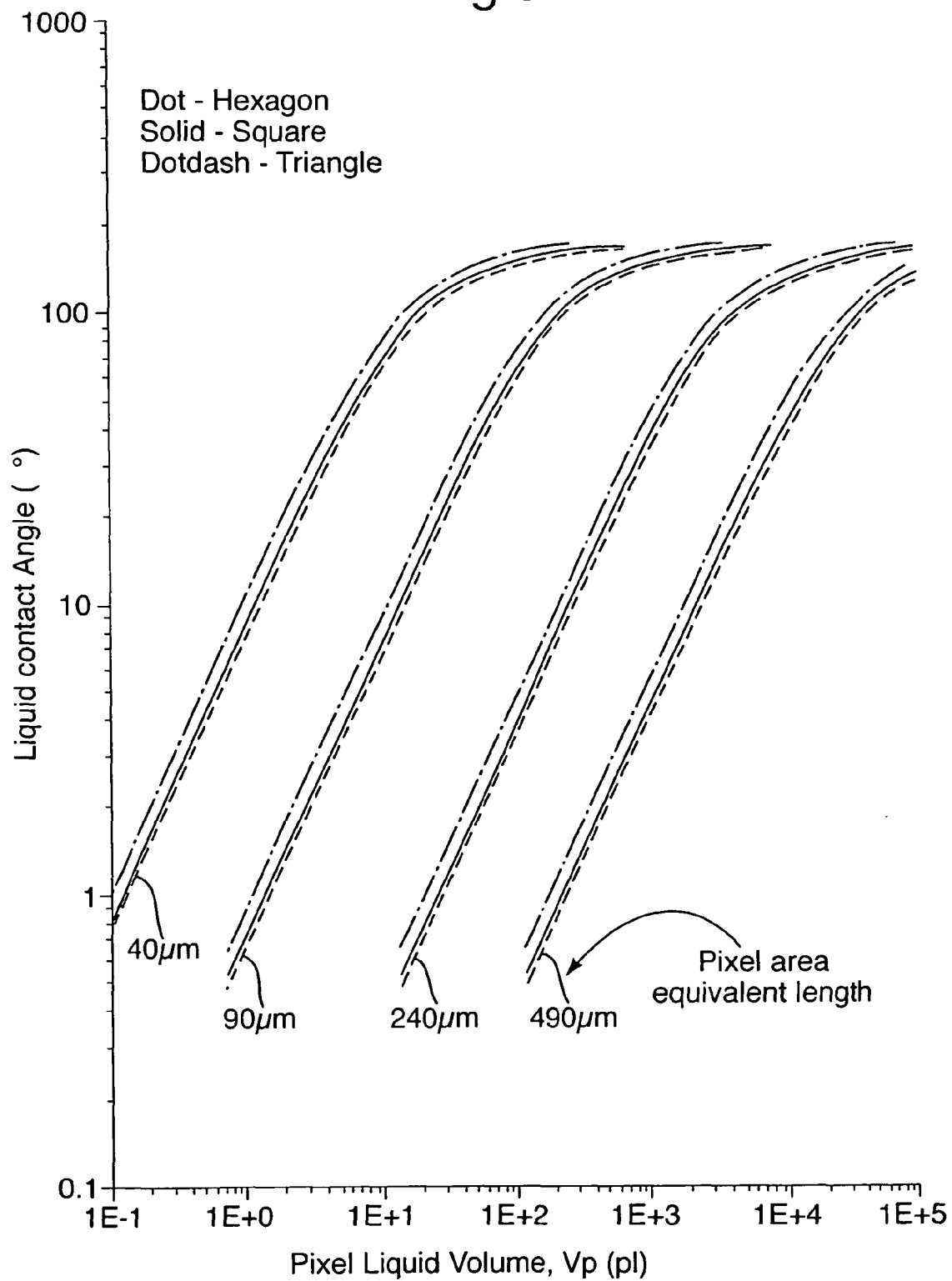
FIG. 8 illustrates the maximum contact angle for triangle, square and hexagonal pixel cell shapes.

It has been determined that the pixel cell shape has little influence on the peak or average metal oxide ink thickness across the TCO layer 402. However, if the volume of the deposited metal oxide ink exceeds the advancing contact angle of the bank material at the bank/ink/air interface, it is likely that the bank structure 410 will be breached and that the metal oxide ink contained in adjacent pixel cells will coalesce. Therefore, a pixel cell shape that minimises the metal oxide ink contact angle at the bank/ink/air interface for a fixed deposition volume is preferable. Additionally, a pixel cell shape that minimises the constriction of the ink on the surface, lowering the minimum surface energy liquid gradient at its periphery is preferable. FIG. 8 illustrates the theoretical maximum contact angle for triangle, square and hexagonal pixel cell shapes.

Where the contact angle is less than 90°, the predicted ratios of maximum contact angle are 2.3:1.9:1.0 for the triangle, square and hexagonal pixel cell structures respectively, each having the same unit area. The contact angle is reduced as the number of pixel edges increases. Thus, a circular pixel cell provides the minimal contact angle at the bank/ink/air interface, thereby accepting the most metal oxide ink before breaching the bank structure 410. However, circular pixel cells inhibit the effective device area due to poor tessellation, reducing device performance compared to pixel cells having a higher packing density. While the triangular pixel cell shape has a better active area foot-print, it is disadvantageous due to the large contact angle of constrained inkjet printed metal oxide ink. Therefore, a hexagonal pixel cell shape or a square pixel cell shape is preferable for use in a DSSC of the present invention.

DSSC's of the present invention have been made with an energy conversion efficiency ($\eta$), an open circuit voltage ($V_{oc}$), a short circuit current ($I_{sc}$) and a fill factor (FF) of 5.0%, 0.48 V, 15 mA/cm$^2$ and 56%, respectively. The variation in energy conversion efficiency of a electrochemical cell of the present invention over a 50 cm$^2$ substrate area is less than 1.5%. This is due to the process stability of the inkjet fabrication method of the present invention.

Wider bank structures 410 are deleterious to both ECD operation, by a reduction in image quality, and DSSC operation, by a reduction in efficiency; resulting from a decrease in active area. Therefore, the bank structure 410 has a preferable width from 0.2 µm to 20 µm. 0.2 µm is the resolution limit for cost effective fabrication of the bank structure 410 by photolithography. 20 µm is considered the maximum effective bank structure 410 width before serious degradation of the image and performance becomes inhibitive, compared to the lowest common display resolutions of 72 dpi. Using inkjet technology hydrophilic pixel cell sizes less than 1 mm$^2$ are readily achievable, though lengths less than several hundred microns are preferred.

In the case of DSSC, absorption of light is proportional to the thickness of the porous metal oxide layer 403. If too thin, a fraction of the incident light will pass unhindered through the metal oxide layer 403, with a loss of potential efficiency. If too thick, once all of the useful light has been completely absorbed, any remaining metal oxide layer 403 thickness will be redundant. Therefore, preferably, the thickness of the deposited metal oxide layer 403 should be between from 0.5 µm to 20 µm.

Moreover, due to the uniformity of the thickness of the metal oxide layer 403 produced by inkjet printing over screen printing, the optimal metal oxide layer 403 thickness can be thinner when using inkjet printing.

Furthermore, in the case of screen printing, the ink viscosity must be much higher than that preferred for inkjet printing. Therefore, the material added to increase viscosity must be removed during the sintering process. Consequently, the as-deposited, pre-sintered metal oxide layer 403 thickness must be greater for screen-printing than for inkjet printing.

Although a bank structure 410 is used to form a matrix of isolated pixel cells on the TCO layer 402, prior to application of the metal oxide ink, the present invention is not limited to banks. Any method of forming isolated pixel cells on the TCO layer 402 may be used, such by creating troughs in the TCO layer 402.

Additionally, although the sensitiser (dye) 4 is formed on the metal oxide layer 403 by immersion of the metal oxide layer 403 in the sensitiser (dye) 404 for a predetermined period of time, the sensitiser (dye) 404 may be formed on the metal oxide layer using different techniques. For example, the sensitiser (dye) 404 may be ink jet printed onto the metal oxide layer 403 following formation of the metal oxide layer 403.

Furthermore, it is not essential for the first transparent conductive oxide layer 402 to be formed of an oxide material for the electrochemical cell of the present invention to function. Additionally, it is not essential for the second transparent conductive oxide layer 406 to be transparent or formed of an oxide material for the electrochemical cell of the present invention to function. Indeed, it is not essential to provide the second substrate (or either substrate in the finished device).

Any suitable material can be used for the bank structures. However, it is preferred to deposit them as a polymer, and more preferably as a polyimide, pattern.

Although liquid electrolytes have been discussed above, solid or gel electrolytes are also suitable for use in the present invention and, in this context, any reference in this specification to providing an electrolyte between an electrode/conductive layer and another element includes forming the electrode/conductive layer and/or the other element on the electrolyte.

The foregoing description has been given by way of example only and it will be appreciated by a person skilled in the art that modifications can be made without departing from the scope of the present invention.

The invention claimed is:

1. An electrochemical cell comprising:
   a first conductive layer;
   a metal oxide layer formed on the first conductive layer, the metal oxide layer being formed of a first metal oxide cell and a second metal oxide cell, the first metal oxide cell and the second metal oxide cell including a plurality of metal oxide particles;
   a first separation portion formed on the first conductive layer, the first separation portion being positioned between the first metal oxide cell and the second metal oxide cell;
   a functional dye layer formed on the metal oxide layer;
   a second conductive layer, at least one of the first conductive layer and the second conductive layer being transparent; and
   a continuous electrolyte layer positioned between the functional dye layer and the second conductive layer,
   wherein the electrolyte layer directly contacts the first metal oxide cell, the second metal oxide cell, and the first separation portion.

2. The electrochemical cell according to claim 1, wherein the first separation portion is a polyimide pattern having a width in a range of 0.2 µm to 20 µm.

3. The electrochemical cell according to claim 1, wherein at least part of the first separation portion is hydro- and/or oleophobic and wherein the first conductive layer is hydro- and/or oleophilic.

4. The electrochemical cell according to claim 1, further comprising:
   a second separation portion, a third separation portion and a fourth separation portion, which are formed on the first conductive layer, the first separation portion, the second separation portion, the third separation portion and the fourth separation portion surrounding the first metal oxide cell, the first separation portion facing the second separation portion, and the third separation portion facing the fourth separation portion.

5. The electrochemical cell according to claim 1, wherein the first metal oxide cell and the second metal oxide cell are substantially square shaped.

6. The electrochemical cell according to claim 1, further comprising:
   an electrocatalytic layer between the electrolyte and the second conductive layer.

7. The electrochemical cell according to claim 6, wherein the electrocatalytic layer is any one of platinum, ruthenium, rhodium, palladium, iridium or osmium.

8. The electrochemical cell according to claim 1, further comprising:
   an insulating substrate on a side of the second conductive layer opposite to the electrolyte.

9. The electrochemical cell according to claim 8, wherein the insulating substrate is plastic.

* * * * *